(12) United States Patent
Paradis et al.

(10) Patent No.: US 8,219,351 B2
(45) Date of Patent: Jul. 10, 2012

(54) METHODS AND SYSTEMS TO ALIGN WAFER SIGNATURES

(75) Inventors: Douglas Edmund Paradis, Richardson, TX (US); Karl Lynn Kenney, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 569 days.

(21) Appl. No.: 12/365,445

(22) Filed: Feb. 4, 2009

(65) Prior Publication Data

US 2010/0169036 A1    Jul. 1, 2010

Related U.S. Application Data

(60) Provisional application No. 61/142,034, filed on Dec. 31, 2008.

(51) Int. Cl.
*H01L 23/043* (2006.01)
(52) U.S. Cl. .................. 702/150; 702/155; 702/189
(58) Field of Classification Search .............. 702/150, 702/155, 189; 700/110, 117; 438/14, 16, 438/800; 382/103, 145; 356/509, 511; 257/E23.001
See application file for complete search history.

(56) References Cited

U.S. PATENT DOCUMENTS

| | | | | |
|---|---|---|---|---|
| 4,607,525 A | * | 8/1986 | Turner et al. | 73/37.5 |
| 6,180,424 B1 | | 1/2001 | Tigelaar et al. | |
| 7,137,085 B1 | * | 11/2006 | Wang et al. | 716/136 |
| 7,760,929 B2 | * | 7/2010 | Orbon et al. | 382/148 |
| 7,843,559 B2 | * | 11/2010 | Furman et al. | 356/237.4 |

\* cited by examiner

*Primary Examiner* — Mohamed Charioui
*Assistant Examiner* — Elias Desta
(74) *Attorney, Agent, or Firm* — Jacqueline J. Garner; Wade J. Brady, III; Frederick J. Telecky, Jr.

(57) ABSTRACT

One embodiment relates to a computer method for aligning wafers processed in a semiconductor fabrication facility. In the method, a first arrangement of dies having a common functionality level is identified on a first wafer. A first alignment signature is assigned to the first wafer based on the first arrangement. A second arrangement of dies having the common functionality level is identified on a second wafer. A second alignment signature is assigned to the second wafer based on the second arrangement. The first alignment signature is compared to the second alignment signature, and the first and second wafers are selectively aligned based on a result of the comparison. Other systems and methods are also disclosed.

12 Claims, 9 Drawing Sheets

ROTATING THE FIRST WAFER OR ZONE MAP, WITH RESPECT TO ONE ANOTHER, THROUGH A NUMBER OF ROTATIONAL ORIENTATIONS, AND STORING A VECTOR REPRESENTING EACH ROTATIONAL ORIENTATION

METHODS AND SYSTEMS TO ALIGN WAFER SIGNATURES

RELATED APPLICATION

This application claims priority to Ser. No. 61/142,034 filed Dec. 31, 2008, which is entitled "Methods and Systems to Align Wafer Signatures".

FIELD

The disclosure herein relates generally to integrated circuits, and more particularly for systems and methods for aligning wafer signatures for further analysis.

BACKGROUND

Semiconductor device fabrication is the process used to create "chips", i.e., integrated circuits, which are present in everyday electrical and electronic devices. Integrated circuit fabrication is a multiple-step sequence of photographic and chemical processing steps during which electronic circuits are gradually created on a semiconductor wafer. Silicon is the most commonly used semiconductor material today, along with various compound semiconductors. The entire manufacturing process from start to packaged chips ready for shipment often takes at least six to eight weeks and is performed in highly specialized facilities referred to as fabs, which often cost several billions of dollars to build.

Figure 1:
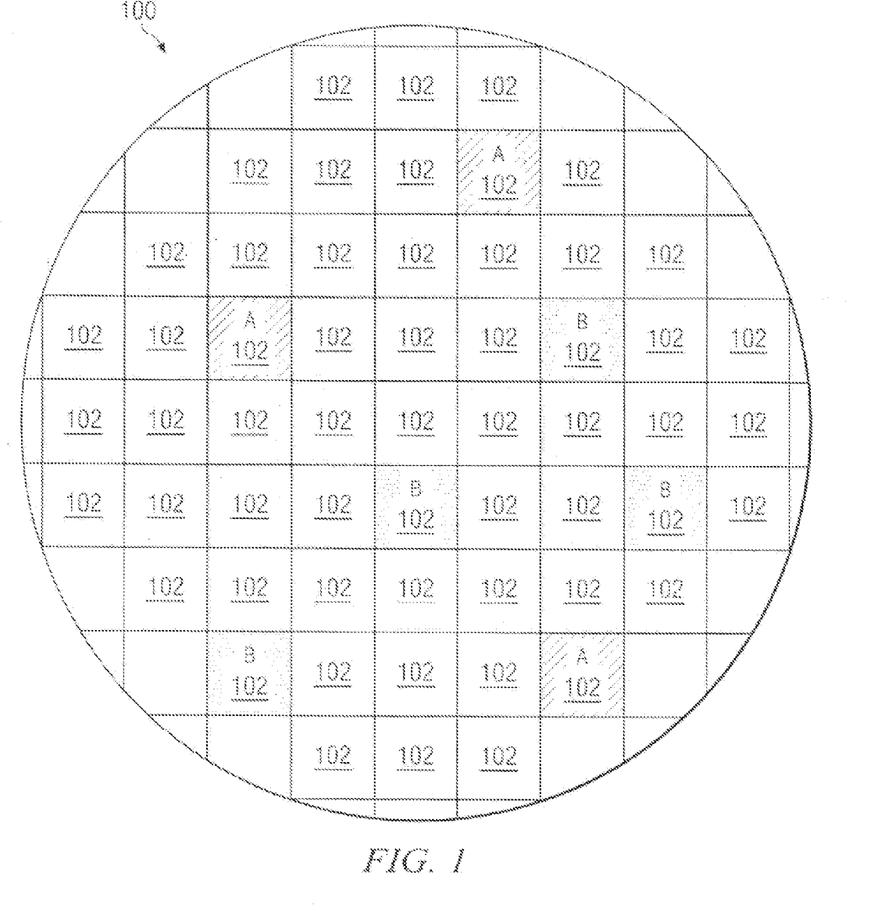
FIG. 1 shows a semiconductor wafer that includes a number of dies.

FIG. 1 shows a typical wafer 100 on which integrated circuits can be manufactured. The wafer includes a grid-like pattern of dies 102. After the wafer 100 is processed in its entirety, it is diced up so each die 102 corresponds to a single integrated circuit. Thus, one wafer often yields tens, hundreds, or even thousands of integrated circuits, depending on the size and complexity of the integrated circuits and the size of the wafer.

At various points in the manufacturing process, the dies 102 are subjected to a variety of electrical tests to determine if they function properly. The electrical tests are performed with an electronic tester that presses tiny probes against the wafer's surface. Dies 102 are often designed with "testability features" such as "built-in self-test" to speed testing, and reduce test costs.

Some of these electrical tests may be as simple as whether a die 102 is "good" or "faulty", wherein the good dies are packaged and sold to customers and faulty chips are disposed of. Other electrical tests may characterize a die 102 in more detailed fashion, assigning the die to one of several different levels of functionality. For example, if a microprocessor chip is designed to operate effectively with a clock frequency of 1.1 GHz, but when manufactured only in fact operates effectively with a clock frequency of 564 MHz, the chip could still be useful in some contexts even though it will not process data as fast as hoped. Therefore, dies with less than optimal functionality can be "binned" out and later sold to customers at a reduced price, thereby allowing the manufacturer to still realize some revenue from the imperfect integrated circuits.

In any event, the dies are tested and categorized according to their level of functionality. For example, in FIG. 1, dies 102A could be categorized as "good", while dies 102B could be categorized as "faulty". Other dies could be categorized to these or other functionality levels. Unfortunately, due to the large number of process steps and significant time needed to manufacture the integrated circuits, it is extremely difficult to adequately diagnose what causes a particular die to exhibit lower functionality relative to another die. Often the location of the lower functional dies on the wafer will exhibit a pattern or signature that can be used to help determine the cause of the reduced functionality. Since many of the process steps used do not physically align the wafers before processing, these fault patterns or signatures often do not appear in the same area, wafer to wafer. This makes diagnostic procedures more difficult. Consequently, there is an on-going need for improved methods and systems for diagnosing problems that give rise to different levels of functionality in processed wafers. These diagnostic methods and systems allow manufacturing problems to be fixed, which improves yields and leads to increased revenues for the manufacturer.

BRIEF SUMMARY

The following presents a summary to provide a basic understanding of one or more aspects of the disclosure herein. This summary is not an extensive overview. It is intended neither to identify key or critical elements nor to delineate scope of the disclosure herein. Rather, its primary purpose is merely to present one or more aspects in a simplified form as a prelude to a more detailed description that is presented later.

One embodiment relates to a computer method for aligning the fault patterns or signatures of wafers processed in a semiconductor fabrication facility. In the method, a first arrangement of dies having a common functionality level is identified on each wafer. A series of alignment signatures are then assigned to each wafer based on the first arrangement. From the series of alignment signatures assigned to each wafer, one optimized signature is chosen as the wafer alignment. This system is applied to each wafer. The unique optimized alignment signature for each wafer is then compared for commonality. Other systems and methods are also disclosed.

The following description and annexed drawings set forth certain illustrative aspects. Other aspects, advantages and/or features may, however, become apparent from the following detailed description when considered in conjunction with the annexed drawings.

NOTATION AND NOMENCLATURE

Certain terms are used throughout the following description and claims to refer to particular system components. As one skilled in the art will appreciate, different companies can refer to a component by different names. This document does not intend to distinguish between components that differ in name but not function herein. In the following discussion and claims the terms "including" and "comprising" are used in an open ended fashion, and thus should be interpreted to mean "including, but not limited to . . . ." Also, the term "couple" or "couples" is intended to mean either an indirect or direct electrical connection. Thus, if a first device couples to a second device, that connection may be through direct electrical connection, or through an indirect electrical connection via other devices and connections. Various numeric values are provided below, but these values are just examples and should not be used to limit the scope of the disclosure. Also, all numeric values are approximate. Further, the term "adjacent" is generally meant to be interpreted as "abutting" and/or "immediately next to," although in some embodiments, the term may be interpreted as "near" or "in close proximity to." Thus, two adjacent items may abut one another or may be separated by an intermediate item(s).

DETAILED DESCRIPTION

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. Nothing in this detailed description is admitted as prior art.

Described herein are methods and systems for aligning wafers so they can be further analyzed. Generally speaking, an alignment signature is determined for each wafer based on an arrangement of dies on the wafer which share a common level of functionality. For example, a probe tester could test all dies on a first wafer, and store the locations of all dies that are completely non-functional to be used in the alignment signature for the first wafer. The alignment signatures of different wafers can then be compared, and if the alignment signatures are sufficiently related, the wafers can be grouped together for further analysis. For example, further analysis can include determining whether wafers that are grouped together have passed through a common tool or tool subsystem during manufacturing. If so, the alignment signature may be indicative that the tool is out-of-specification, and a repair person can be sent out to analyze whether the tool is working properly.

Figure 2:
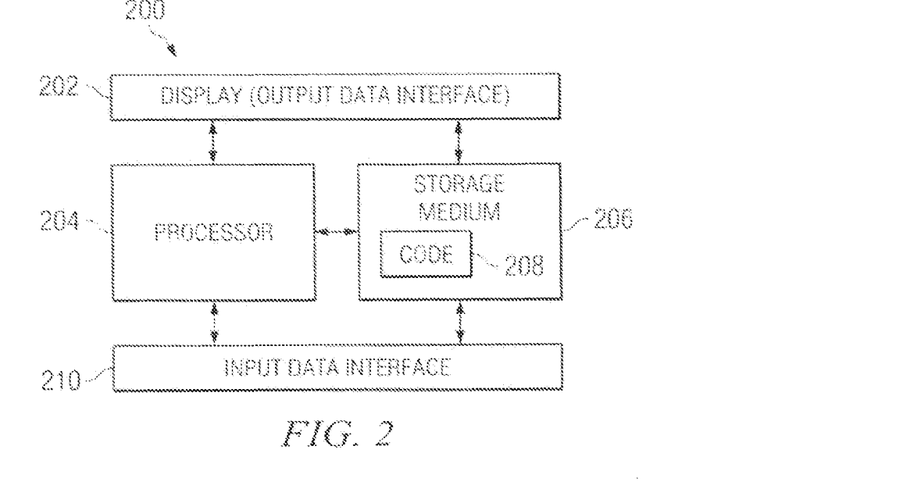
FIG. 2 shows a functional block diagram of a system in accordance with some embodiments.

FIG. 2 depicts a system 200 for implementing computer methods described herein. The system 200 includes a display 202 coupled to a processor 204. The processor 204 may be coupled with a storage medium 206 such as volatile or non-volatile memory that stores processor executable code 208 capable of causing the processor 204 to perform the processes described herein. Probe testing control and analysis code and/or other appropriate programs and files may also be stored in the storage medium 206 which may be located locally or in remote databases accessible by network protocols and are often input via an input data interface 210. The processor 204 may retrieve and execute the code 208 to perform computer methods included herein.

Figure 3:
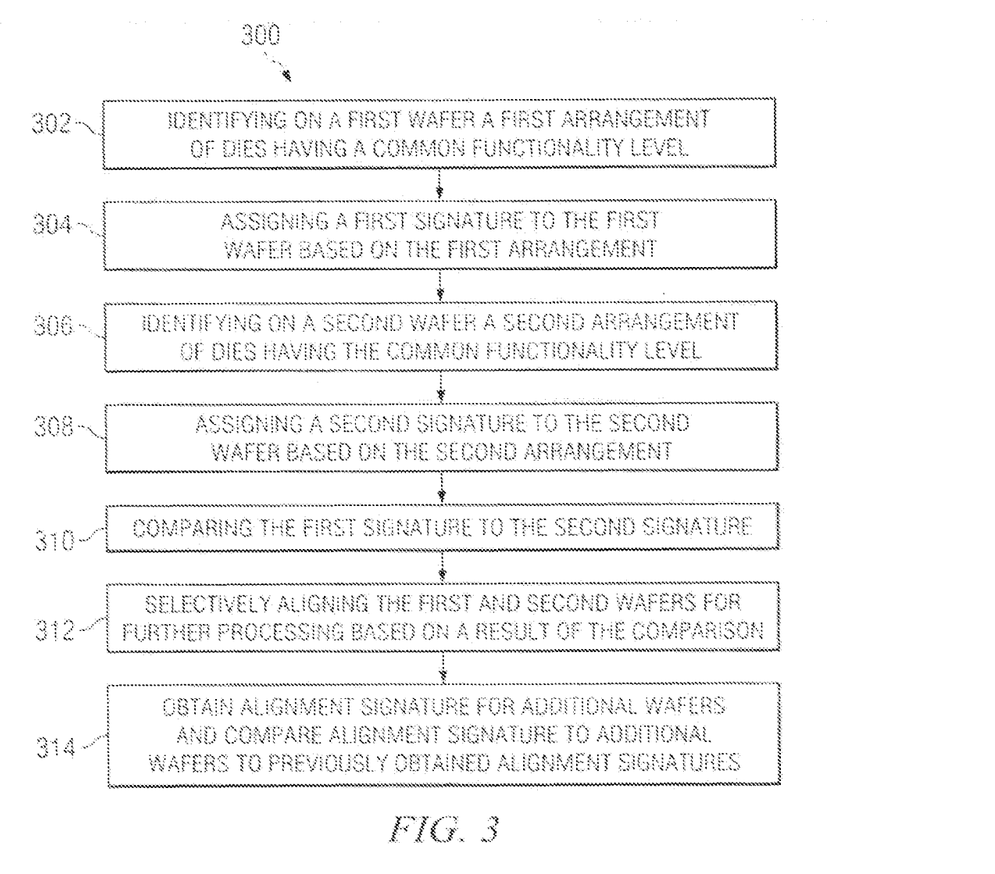
FIG. 3 shows a somewhat generalized flow chart of a method for analyzing wafers for alignment.
Figure 4:
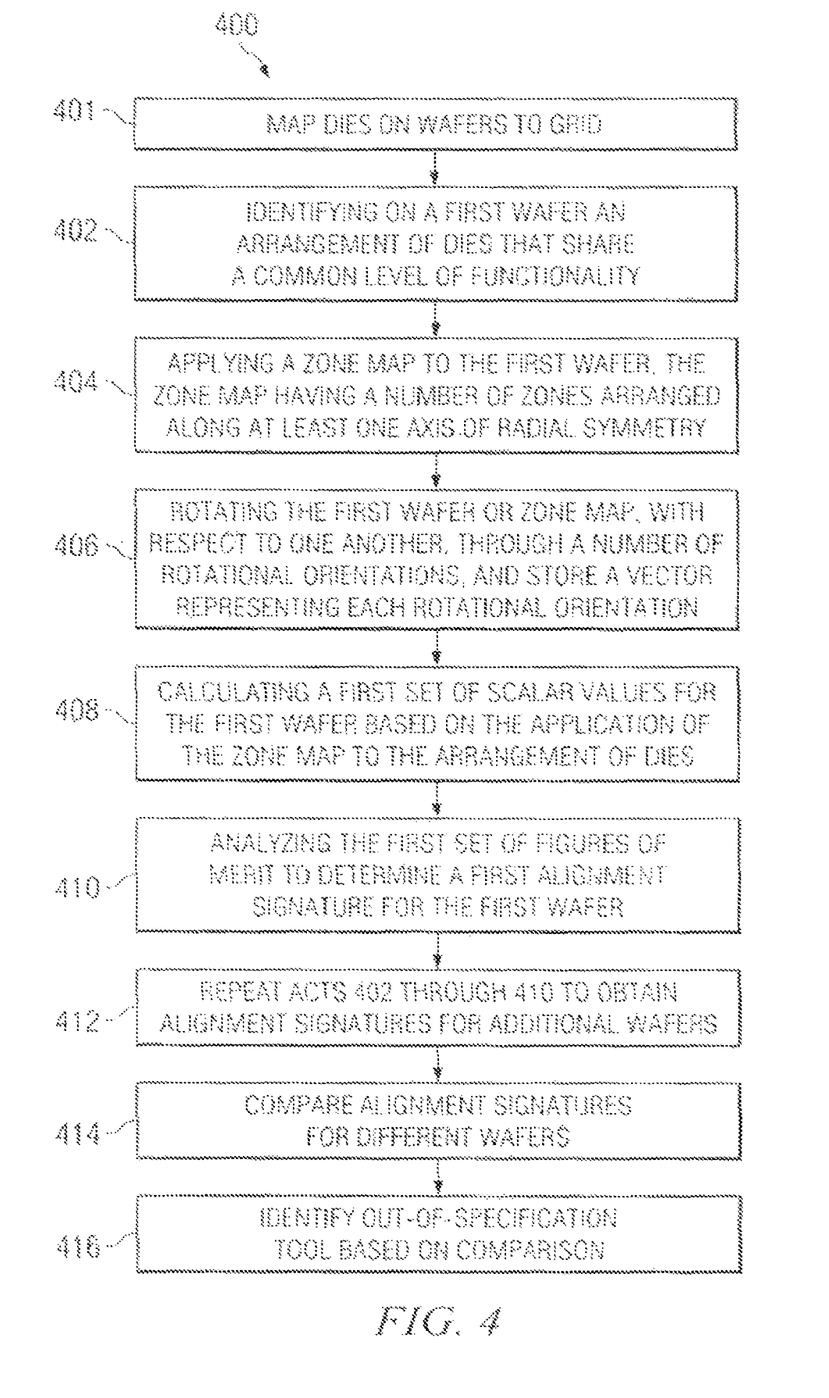
FIG. 4 shows a more detailed flow chart of a method for analyzing wafers for alignment.

To clearly illustrate one manner in which the system 200 may carry out the methods disclosed herein, FIG. 3 shows a somewhat general method 300 and FIG. 4 shows a more specific method 400 for aligning wafers by using alignment signatures. Although the methods disclosed herein are illustrated and described as a series of acts or events, it will be appreciated that the present invention is not limited by the illustrated ordering of the acts or events. For example, some events may occur in different orders and/or concurrently with other events apart from those illustrated and/or described herein, in accordance with the invention. In addition, not all illustrated events may be required to implement a methodology in accordance with the present invention. These computer methods could be carried out on the system 200 previously described, as well as other systems not explicitly set forth herein.

FIG. 3's method 300 starts at block 302, where a first arrangement of dies having a common functionality level is identified on a first wafer. For example, the method may perform electrical tests on individual dies on the wafer, and store a functionality level for each die. Dies having a common functionality level (e.g., faulty dies) are grouped together in the first arrangement.

At 304, a first alignment signature is assigned to the first wafer based on the first arrangement. Although not explicitly shown in FIG. 3, the first alignment signature may take in account arrangements for several different functionality levels (e.g., binned functionality levels).

In 306, a second arrangement of dies having the common functionality level (e.g., faulty dies) is identified on a second wafer. After a second alignment signature is assigned to the second wafer based on the second arrangement at 308, the first and second alignment signatures are compared at 310.

At 312, based on a result of the comparison, the first and second wafers are selectively aligned with one another for further analysis. As indicated by 316, additional wafers may be processed in an on-going manner.

As an example of one type of further analysis that can be performed, if the method 300 determines that the first and second wafers, when aligned, have similar arrangements of faulty dies, then the method may attempt to identify a cause of this similar arrangement. For purposes of illustration, consider an example where a manufacturing facility includes dozens of wafer processing tools (e.g., numerous ion implanters, CVD chambers, steppers, etc.). If the first and second wafers, which exhibit a similar arrangement of faulty dies, are processed by different tools or tool subsystems at most steps in manufacturing process but are processed by the same stepper, it is possible that the stepper which processed both wafers is out-of-specification. The method can then dispatch a repair person or technician to examine the stepper to determine if the stepper is, in fact, out-of-specification. Therefore, by continuously monitoring the functionality level of dies and identifying out-of-specification tools therefrom, the method 300 can improve yield and ultimately increase efficiency and revenue for the fab.

FIG. 4 shows a more particular methodology 400 that is discussed below with reference to FIGS. 5-9. Although FIGS. 5-9 illustrate one particular manner for carrying out FIG. 4's methodology, it will be appreciated that there are other manners of carrying out this methodology and these illustrations do not limit the scope of this disclosure in any way.

FIG. 4 starts at block 401, wherein dies on the wafer are mapped to a grid used for all wafers. This block allows the method 400 to compare signatures of wafers that include different numbers of dies. For example, in a fab where all wafers processed are 300 mm in diameter, one wafer could consist of 16 dies while another wafer could consist of 100 dies. To allow for comparison of these wafers, it is useful to map the dies to a grid. For purposes of simplicity, the remainder of this example does not include die mapping (i.e., block 401), but rather the dies themselves are used to calculate signatures. It will be appreciated, however, that die mapping is incorporated into various embodiments.

Figure 5:
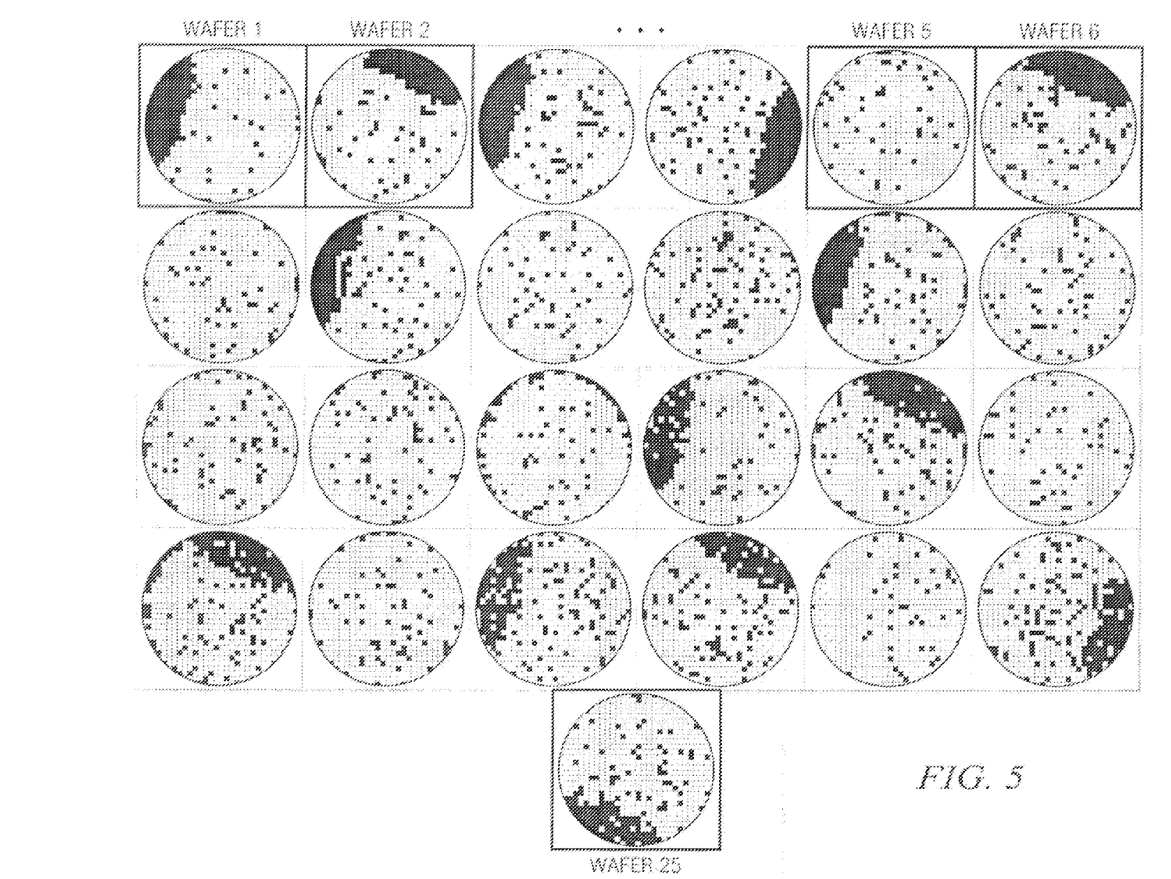
FIGS. 5-9 show more detailed views of method sub-blocks consistent with FIG. 4's method.

Referring now to FIG. 5, one can see a series of wafers. Each wafer has been processed in the fabrication facility and includes a number of dies arranged in a grid-like pattern. Each die has been tested to determine its functionality level. In the illustrated embodiment, different shading styles represent different functionality levels. Due to process variation, the wafers differ from one another in the extent to which they exhibit some spatial variation in their functionality level across their dies. The following slides show one manner in which the first wafer is analyzed. Other wafers can be analyzed in a similar fashion.

Figure 6:
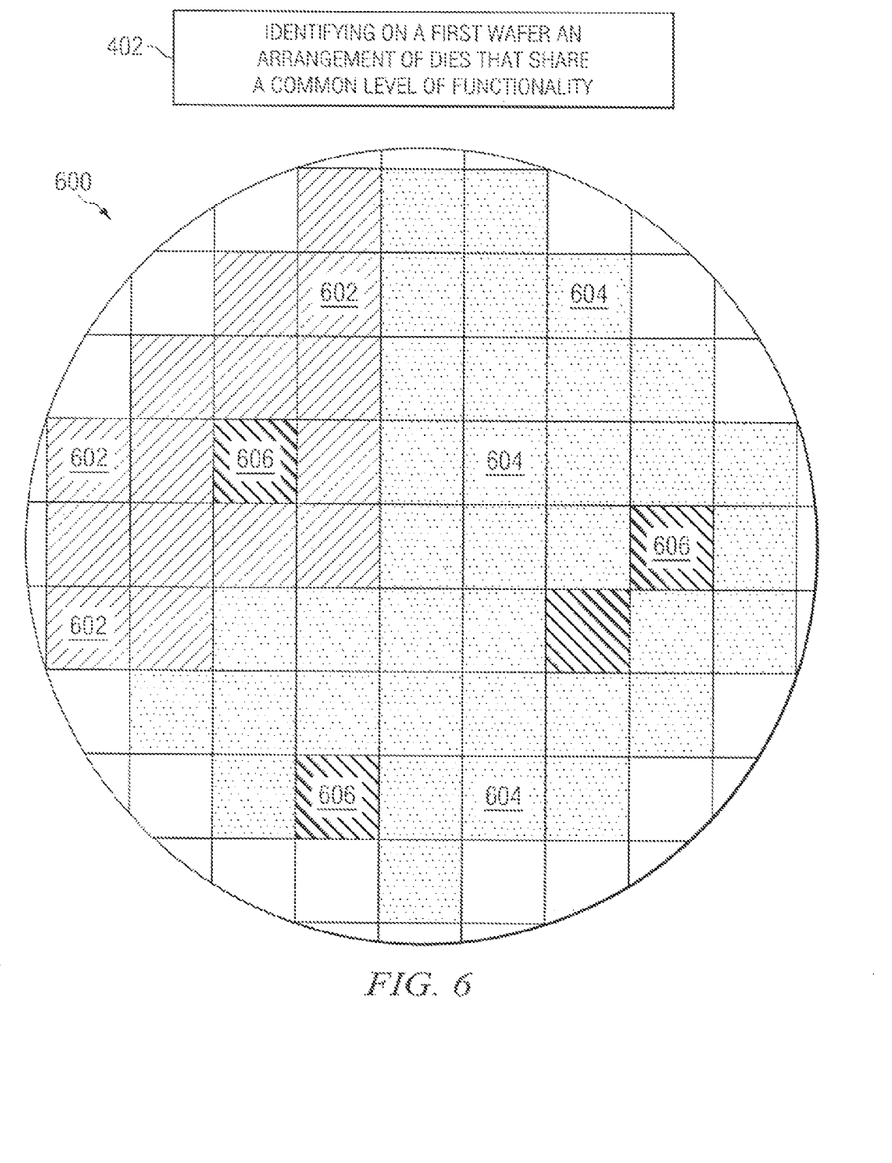

In FIG. 6, a first arrangement of dies sharing a common level of functionality is identified on the first wafer 600. For example, in the illustrated embodiment the first arrangement includes dies 602, which have a first functionality level. This first functionality level differs from that of other dies on the wafer. For example, dies 604 have a second different functionality level, and dies 606 have a third functionality level. Other arrangements having other functionality levels are also included.

Figure 7:
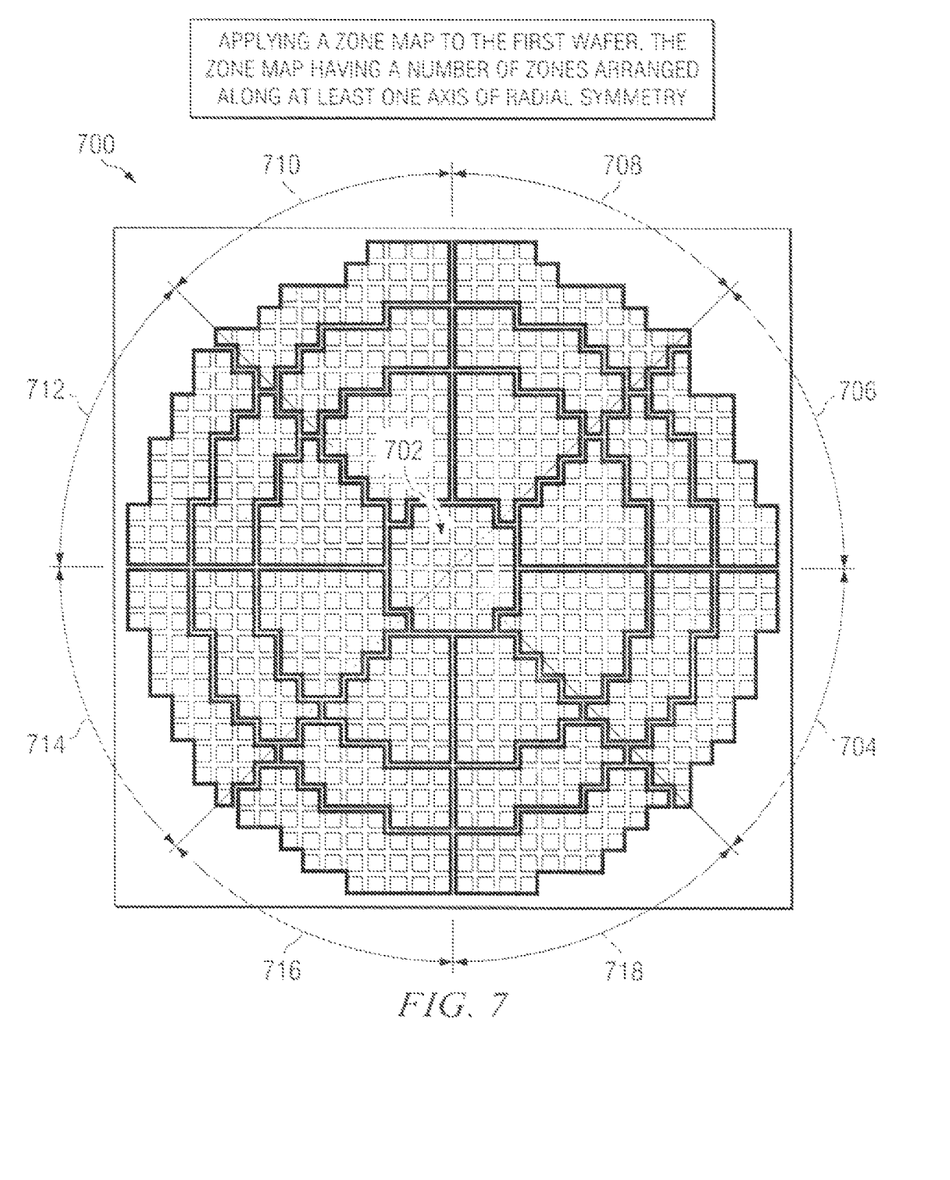

In FIG. 7 a zone map 700, which includes twenty five zones in this example, is applied to the first wafer. The illustrated zone map 700 includes a central region 702, and eight axial regions (labeled "704" through "718"). Each axial region includes three sub-regions, thereby forming a hub-and-spoke geometry. In other embodiments, the zone map can include more zones or fewer zones, and can have geometries other than the hub and spoke geometry illustrated in FIG. 7. For simplicity, the remaining blocks of the method will be discussed with respect to eight radial zones (labeled zones "1" through "8").

Figure 8A:
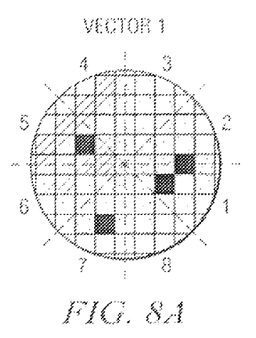
Figure 8B:
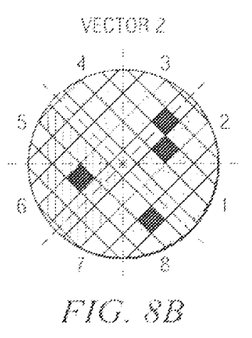
Figure 8C:
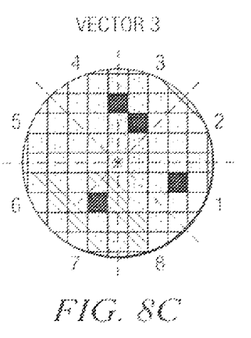
Figure 8D:
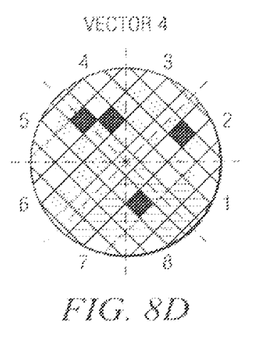
Figure 8E:
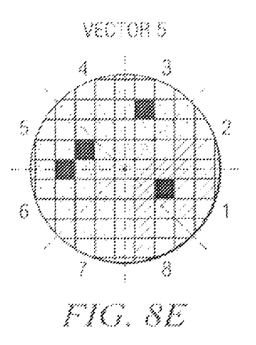
Figure 8F:
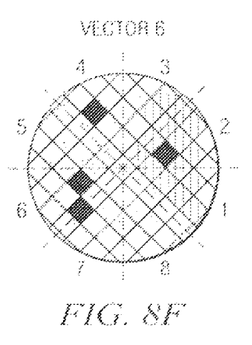
Figure 8G:
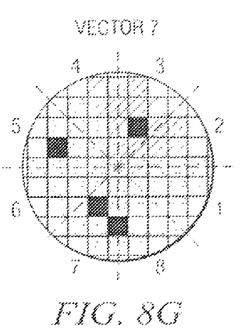
Figure 8H:
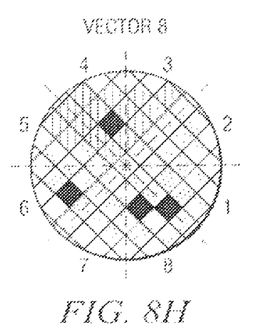

As shown in FIG. 8A-8H, the wafer and zone map are rotated with respect to one another through a number of rotational orientations. For each orientation a vector is stored, wherein the vector includes a number of vector elements. Each vector element corresponds to a functionality level for a given zone. For example, in FIG. 8A (which shows only eight zones for purposes of simplicity) a first vector having eight vector elements is obtained. The first vector element corresponds to a functionality level for the dies in zone "1", the second vector element corresponds to a functionality level for the dies in zone "2", and so on. In FIG. 8B, a second vector is calculated in a similar manner for the zone map which is offset by 45° relative to FIG. 8A. Other vectors are calculated for FIGS. 8C-8H. Consequently, in this example, eight vectors are obtained for each wafer, where each vector includes eight vector elements.

Figure 9A:
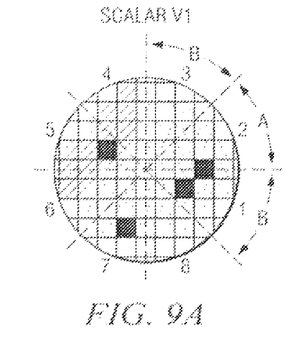
Figure 9B:
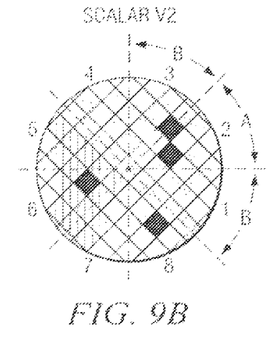
Figure 9C:
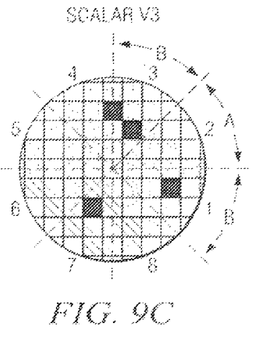
Figure 9D:
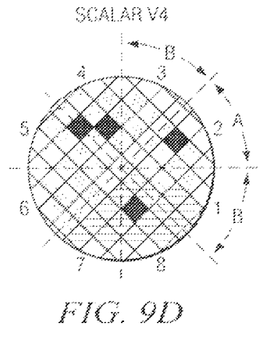
Figure 9E:
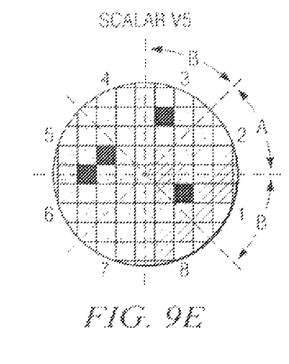
Figure 9F:
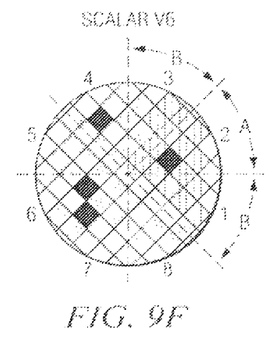
Figure 9G:
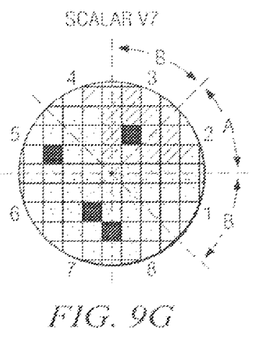
Figure 9H:
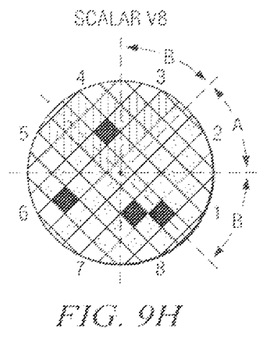

As shown in FIG. 9A-9H, a scalar value is calculated for each vector. More specifically, the scalar value relates to a fixed position in the zone map, such that each scalar value corresponds to a different radial axis on the wafer. In the illustrated embodiment, the scalar value is calculated based on the functionality levels of three contiguous axial regions. For example, in FIG. 9A, a first scalar value is calculated for the three contiguous axial regions (i.e., zones "1", "2", and "3"). In performing this calculation, the zones may be assigned different weights. In FIG. 9B, a second scalar value is calculated for the three contiguous regions 904 (i.e., zones "1", "2" and "3"). Other scalar values are calculated for the other vectors in a similar manner.

After the eight scalar values are calculated, the eight scalar values are compared to one another and the maximum or minimum scalar value is noted. For example, scalar V6 (FIG. 9F), which includes the most faulty dies within the three contiguous zones, is calculated to be the maximum or minimum scalar value for the first wafer. Therefore, vector 6, which may also be referred to as an alignment signature, is then selected to be representative of the first wafer for further analysis.

Figure 10:
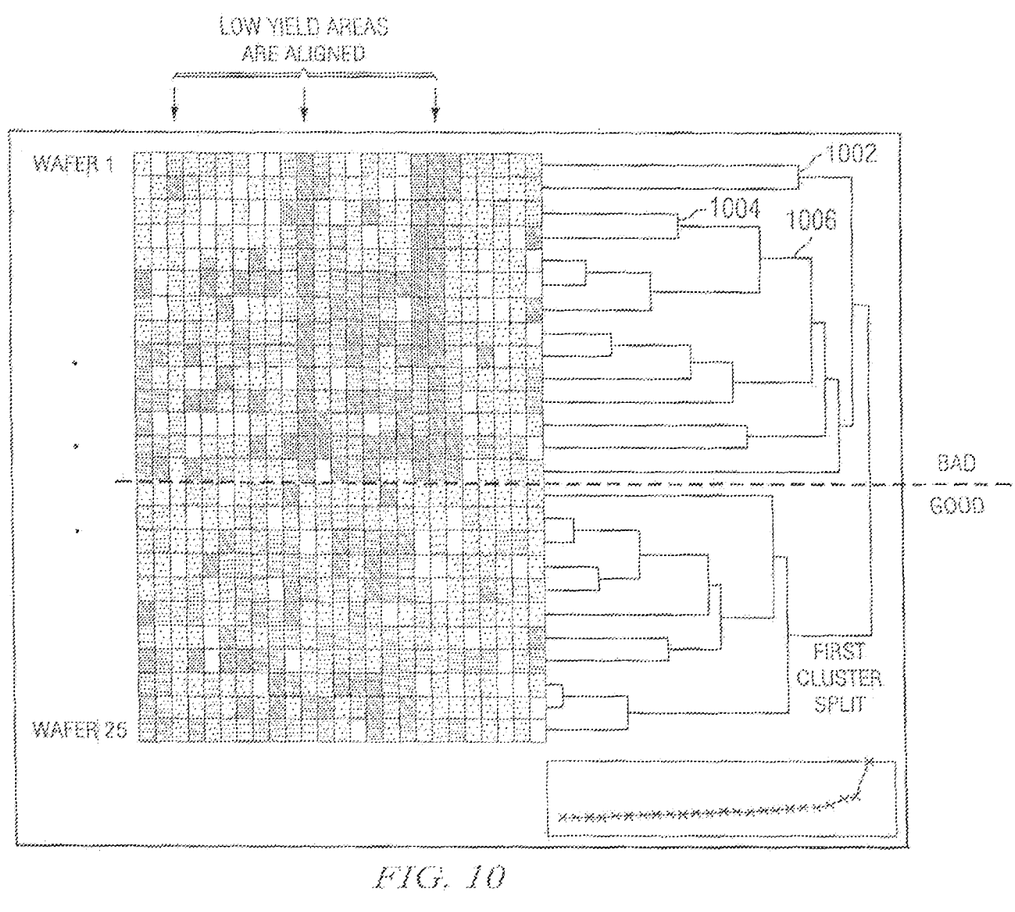
FIG. 10 shows a chart illustrating a more detailed depiction of one manner in which alignment signatures may be evaluated.

The other wafers are then processed in a similar manner, whereby an alignment signature is obtained for each wafer. As successive alignment signatures are obtained, the most recent alignment signature is compared to previous alignment signatures. If two or more alignment signatures are sufficiently related, the method notes this and then can use these two or more alignment signature for further analysis. FIG. 10 shows a more detailed manner for analyzing the extent to which several alignment signatures are related. The left (grid-like) portion of FIG. 10 represents the functionality levels for different dies on each wafer. In this example, the data for each wafer is in a separate row, and each vector element corresponds to a different column. Thus, one can see that low-yield areas tend to "align" when the wafers are properly rotated. On the right-hand side of FIG. 10, one can see that the wafers can be analyzed for hierarchical clustering, wherein each wafer is compared to the other wafers to see which wafers are most similar in various respects. For example, as shown by the first "bracket" 1002, wafers #1 and #2 are most similar in one respect, while the second "bracket" 1004 shows wafers #3 and #4 are most similar in another respect. Other groups (e.g., wafers 3, 4, 5, 6, and 7 in bracket 1006) are "clustered" together at other hierarchical layers.

As previously discussed, if the alignment signatures exhibit a common arrangement of faulty dies or functionality levels that is less than ideal, the method can attempt to correlate the wafers based on the path the wafers have taken through the fab. If possible, an out-of-specification tool can be identified and repaired based on this analysis.

The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein. Further, some regions that are illustrated as having distinct or abrupt edges may not be so precisely delineated, but may instead blend slightly with other regions. This is particularly true of doped or implanted regions that may diffuse with other regions, particularly at abutting edges.

What is claimed is:

1. A non-transitory computer readable medium containing computer instructions stored therein for causing a computer processor to perform a method for aligning wafers processed in a semiconductor fabrication facility, comprising:

identifying on a first wafer a first arrangement of dies having a common functionality level;

assigning a first alignment signature to the first wafer based on the first arrangement, wherein assigning the first alignment signature to the first wafer comprises:

applying a zone map to the first wafer, the zone map having a number of zones arranged along at least one axis of radial symmetry;

rotating the first wafer or zone map, with respect to one another, through a number of rotational orientations and storing a vector at each rotational orientation;

calculating a first set of scalar values, each scalar value of the first set calculated at a different rotational orientation of a vector relative to the first wafer; and analyzing the first set of scalar values to determine the first alignment signature;

identifying on a second wafer a second arrangement of dies having the common functionality level;

assigning a second alignment signature to the second wafer based on the second arrangement; comparing the first alignment signature to the second alignment signature; and selectively aligning the first and second wafers based on a result of the comparison.

2. The method of claim 1, further comprising:

if the wafers are aligned, then identifying at least one out-of-specification tool that processed both the first and second wafers in the semiconductor fabrication facility.

3. The method of claim 1, wherein analyzing the first set of scalar values to determine the first alignment signature comprises:

identifying a minimum or maximum scalar value in the first set of scalar values to determine the first alignment signature.

4. The method of claim 1, wherein assigning the second alignment signature to the second wafer comprises:

applying the zone map to the second wafer;

rotating the second wafer or zone map, with respect to one another, through a number of rotational orientations and storing a vector at each rotational orientation;

calculating a second set of scalar values, each scalar value of the second set calculated at a different rotational orientation of a vector relative to the second wafer; and analyzing the second set of scalar values to determine the second alignment signature.

5. The method of claim 4, wherein selectively aligning the first and second wafers comprises:

correlating a minimum or maximum scalar value in the first set to a first axis of interest for the first wafer;

correlating a minimum or maximum scalar value in the second set to a second axis of interest for the second wafer; and aligning the first and second axes of interest.

6. The method of claim 1, further comprising:

mapping dies on the first wafer to a grid; and mapping dies on the second wafer to the grid; and performing the selective alignment of the first and second wafers based on how the dies are aligned with respect to the grid.

7. A non-transitory computer readable medium containing computer instructions stored therein for causing a computer processor to perform a method for aligning wafers processed in a semiconductor fabrication facility, comprising:

identifying on a first wafer an arrangement of dies that share a common level of functionality, the common level of functionality differing from at least another level of functionality for other dies on the first wafer;

applying a zone map to the first wafer, the zone map having a number of zones arranged along at least one axis of radial symmetry;

rotating the first wafer or zone map, with respect to one another, through a number of rotational orientations;

calculating a first set of scalar values for the first wafer based on the application of the zone map to the arrangement of dies, each scalar value of the first set calculated at a different rotational orientation; and analyzing the first set of scalar values to determine a first alignment signature for the first wafer.

8. The method of claim 7, wherein some of the number of zones are weighted differently from other of the number of zones during calculation of the first set of scalar values.

9. The method of claim 7, wherein less than all zones in the zone map are used to calculate a scalar value of the first set.

10. The method of claim 7, further comprising:

identifying on a second wafer a number of dies that share the common level of functionality, the common level of functionality differing from at least another level of functionality for other dies on the second wafer;

applying the zone map to the second wafer;

rotating the second wafer or zone map, with respect to one another, through a number of rotational orientations;

calculating a second set of scalar values for the second wafer, each scalar value of the second set calculated at a different rotational orientation; and analyzing the second set of scalar values to determine a second alignment signature for the second wafer.

11. The method of claim 10, further comprising:

comparing the first alignment signature to the second alignment signature; and selectively aligning the first and second wafers based on a result of the comparison.

12. The method of claim 7, further comprising:

mapping a die having a first area on the first wafer to a grid-element having a second area differing from the first area, thereby allowing for data processing of different size dies.

* * * * *